United States Patent [19]

Malik et al.

[11] Patent Number: 5,249,152
[45] Date of Patent: Sep. 28, 1993

[54] BOOKKEEPING MEMORY

[75] Inventors: Ashgar K. Malik, Escondido; David C. Lee, San Diego, both of Calif.; Klaus G. Dudda, deceased, late of Roseville, Minn., by Sabine U. Dudda, administratrix

[73] Assignee: Unisys Corporation, Blue Bell, Pa.

[21] Appl. No.: 717,945

[22] Filed: Jun. 20, 1991

[51] Int. Cl.⁵ ............................................. G11C 7/00
[52] U.S. Cl. ............................. 365/201; 365/189.01; 365/218
[58] Field of Search .................. 365/189.01, 201, 218; 371/52

[56] References Cited

U.S. PATENT DOCUMENTS 4,934,826 6/1990 Miyatake et al. ............... 365/189.01
4,949,309 8/1990 Rao ..................................... 365/218
4,958,326 9/1990 Sakurai ............................... 365/218
5,150,329 9/1992 Hoshi ............................. 365/189.01

Primary Examiner—William L. Sikes
Assistant Examiner—Toan Tran
Attorney, Agent, or Firm—Charles J. Fassbender; Mark T. Starr

[57] ABSTRACT

A bookkeeping memory is disclosed in which a row-column matrix of storage cells are written by row and cleared by column, and output signals are generated that indicate which rows of cells are in a "0" state. Bookkeeping functions are performed extremely fast by correlating one set of items to the rows, correlating a related set of items to the columns, and performing row write/column clear/zero row detect operations in the memory.

15 Claims, 2 Drawing Sheets

BOOKKEEPING MEMORY

BACKGROUND OF THE INVENTION

This invention relates to digital integrated circuit memories; and more particularly, it relates to architectures for such memories which enable a digital computer to perform various bookkeeping operations at a very high speed.

In the prior art, digital integrated circuit memories have been extensively used in data processing systems. These memories are broadly classified as RAMs, ROMs, or CAMs. Each such memory includes a plurality of storage cells; but, each such memory also has a unique overall architecture which differentiates it from the other memories.

In a RAM memory, the storage cells are arranged on a chip as an array f row and columns, and control lines are provided which enable data to be written into and read from the cells one row at a time. RAMs are particularly useful where data words need to be written and read in any sequence from rows that are selected randomly.

In a ROM memory, the storage cells are again arranged on a chip as an array of rows and columns; however, the data is either permanently written into the cells, or the data can only be rewritten off-line. Also, a ROM cell occupies less chip space then a RAM cell; and thus, a ROM memory chip can contain more cells then a RAM memory chip. ROM memories are particularly useful for storing large amounts of fixed digital information, such as thousands of computer instructions.

In a CAM memory, the memory cells are again arranged as an array of rows and columns; and control lines are provided which enable data to be written into the cells one row at a time. In addition, a comparator is provided with each row of cells, and input lines are provided which carry input signals to each of the comparators. In operation, those input signals are compared to the data in each row of memory cells, and output signals are generated which indicate whether or not a match occurs. CAM memories are particularly useful in data caches and instruction caches.

One common feature of the above prior art memories is that data in each memory is always read, or written, or compared row by row. However, such row oriented operations are not well suited for performing certain bookkeeping functions in which various relationships between two sets of items continuously change and need to be tracked These bookkeeping functions are explained more fully herein in the Detailed Description.

Accordingly, a primary object of the present invention is to provide a memory having a novel architecture which efficiently performs bookkeeping functions with high speed.

BRIEF SUMMARY OF THE INVENTION

In accordance with the present invention, a novel memory is disclosed which is comprised of: 1) a plurality of storage cells that are intercoupled as a matrix of rows and columns 2) a row write circuit for selecting the storage cells by row and respectively writing each of the storage cells of a selected row to a "1" or "0" state; 3) a column clear circuit for selecting the storage cells by column and for clearing all of the storage cells of a selected column to the "0" state; and, 4) a zero row detect circuit for generating output signals indicating which rows of the storage cells are all in the "0" state.

To perform a bookkeeping function, each row of the memory is correlated to a particular item in a first set of items and, each column of the memory is correlated to a particular item in a second set of items which are related in some fashion to the items of the first set. Then, the relationships between the items that are correlated to the rows and the columns are quickly updated by the row write and column clear circuits, and the effect of each update is quickly sensed via the zero row detect circuits.

BRIEF DESCRIPTION OF THE DRAWINGS

Various features and advantages of the invention are described in detail herein in conjunction with the accompanying drawings wherein.

DETAILED DESCRIPTION OF THE INVENTION

Figure 1:
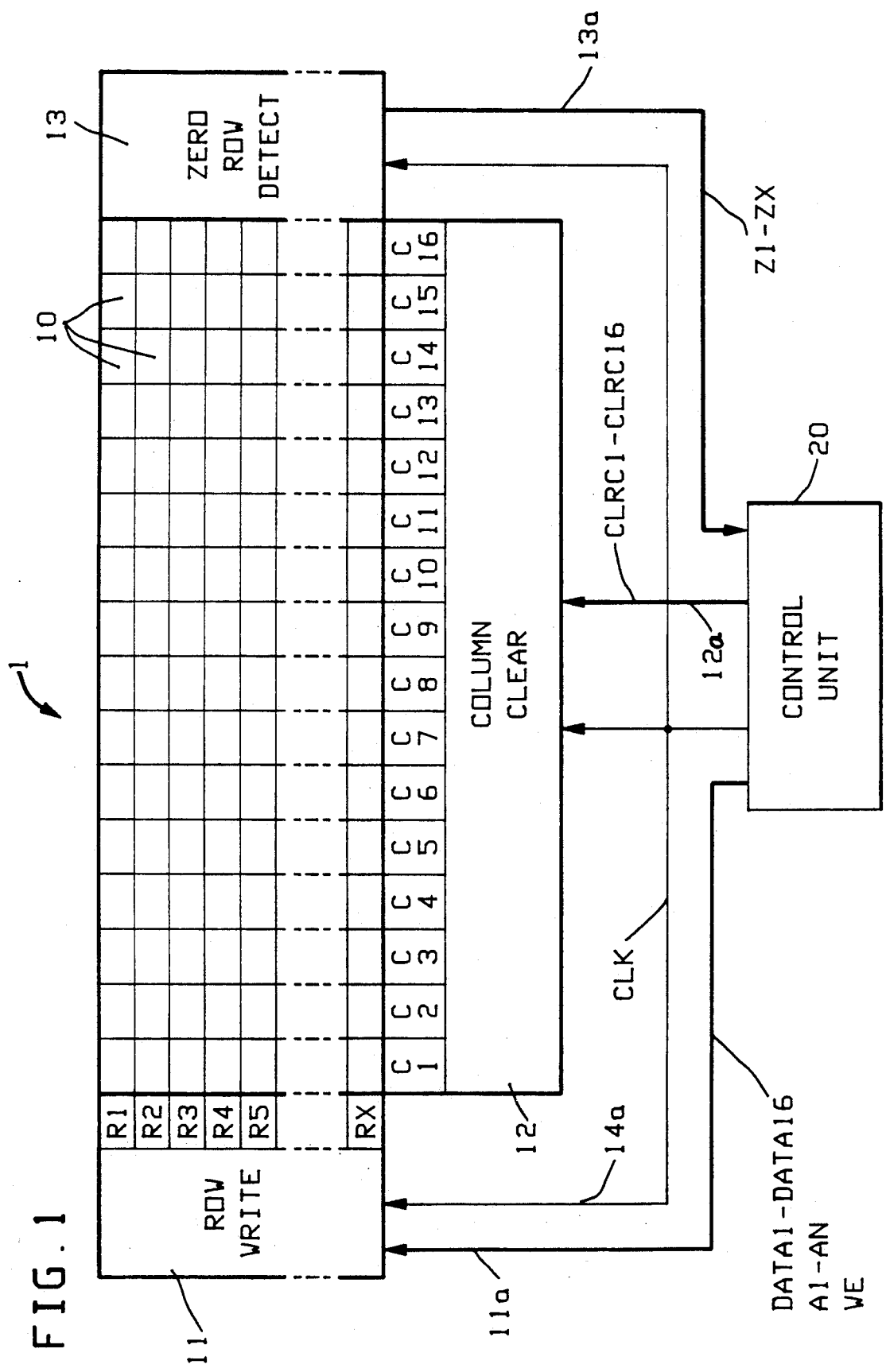
FIG. 1 shows the overall architecture of a bookkeeping memory whose structure is in accordance with the present invention; and, FIG. 2 is a detailed circuit diagram of a preferred embodiment of the memory of FIG. 1.

Referring now to FIG. 1, the overall architecture for the disclosed bookkeeping memory 1 will be described. This memory 1 includes a plurality of storage cells 10 which are intercoupled as a matrix of rows and columns, a row write circuit 11 which selects the storage cells by row and selectively writes a "1" or "0" into each of the storage cells of the selected row, a column clear circuit 12 which selects the storage cells by column and writes a "0" into all of the storage cells of the selected column, and a zero row detect circuit 13 which generates output signals indicating which rows of storage cells store all "0". In the FIG. 1 memory, there are "X" rows of cells R1-RX and sixteen columns of cells C1-C16; but that is just one illustrative example. In the general case, the FIG. 1 memory can have "X" rows and "Y" columns of cells, where "X" and "Y" are any positive integers.

To control the operation of the row write circuit 11, a set of input lines 11a is provided which carries address signals A1-AN, data input signals DATA1-DATA16, and a write enable signal WE. To control the operation of the column clear circuit 12, another set of input lines 12a is provided which carries column clear signals CLRC1-CLRC16. Also, from the zero row detect circuit 13, a set of output lines 13a is provided which carries output signals Z1-ZX. All of the signals on the lines 11a, 12a, and 13a are synchronized to a clock input signal CLK on an input line 14a.

In operation, a control module 20 generates all of the input signals and receives all of the output signals on the lines 11a-14a. Control unit 20 can be any type of sequential state machine; and for example, it can be a general purpose programmable digital computer.

To write the DATA1-DATA16 signals respectively into the storage cells of the I-th row, control module 20 generates the A1-AN address signals such that their binary value equals "I", and simultaneously it sets the WE signal to a "1". Those signals must be firm while signal CLK is "0". To clear all of the cells in the J-th column, control module 20 sets the CLRCJ signal to a "1", and keeps all remaining CLRC signals at a "0". Those signals must be firm while signal CLK is "0". And, to detect that all of the cells in the K-th row are in a "0" state, control module 20 samples signal ZK while clock signal CK is a "1".

Also in the FIG. 1 memory, the above row write and column clear operations can be performed simultaneously. When that occurs, the column clear operation overrides the row write operation in whichever cell is common to the particular row that is being written and the particular column that is being cleared. Further in the FIG. 1 memory, the cells of multiple columns can be cleared to "0" simultaneously. Also, a row write and multiple clear column operations can occur simultaneously, in which case the column clear overrides the row write in all cells which are common to the written row and anyone of the cleared columns.

Figure 2:
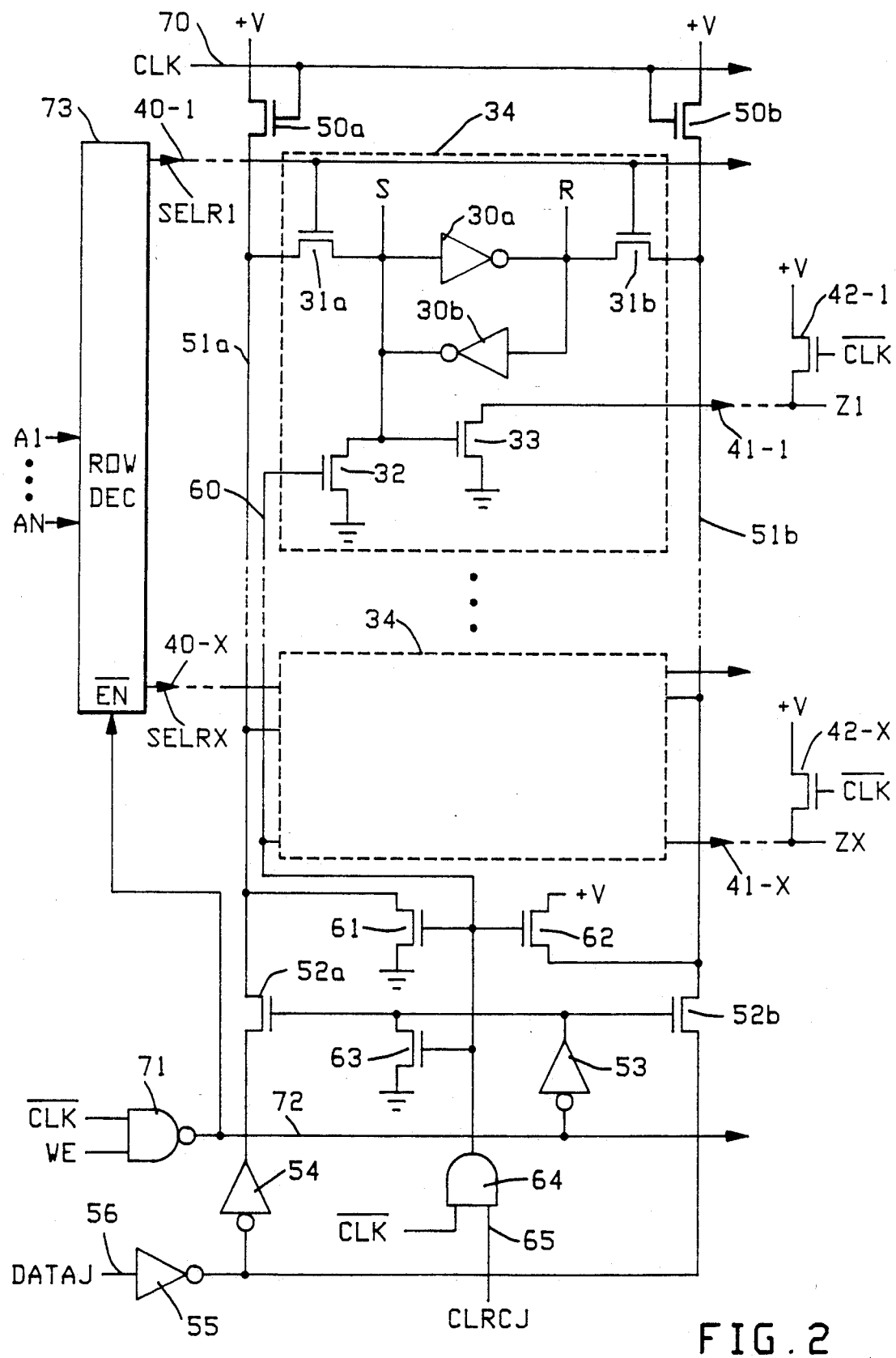

Turning now to FIG. 2, it shows all of the circuit details of a preferred embodiment of the FIG. 1 memory. In FIG. 2, circuit components which are identified by reference numerals 30a, 30b, 31a, 31b, 32, and 33 are repeated at each row-column intersection. Those components are grouped within the dashed line 34.

Also in FIG. 2, circuit components which are identified by reference numerals 40-1, 41-1 and 42-1 occur in just the first row R1. Corresponding components which are identified by reference numerals 40-x, 41-x, and 42-x occur only in the last row; and, each intervening row includes similar circuitry.

Further in FIG. 2, each column contains a first group of components which are identified by reference numerals 50a, 50b, 51a, 51b, 52a, 52b, 53, 54, 55, and 56; and, each column also includes a second group of components that are identified by reference numerals 60, 61, 62, 63, 64, and 65. Lastly, in FIG. 2 circuit components that are identified by reference numerals 70, 71, 72 and 73 occur only one time.

Each of the components 30a, 30b, 53, 54, and 55 is an inverter; each of the components 31a, 31b, 32, 33, 42-1, 42-x, 50a, 50b, 52a, 52b, 61, 62, and 63 is an N-channel field effect transistor; component 64 is an AND logic gate; component 71 is a two input NAND gate; and component 73 is a binary decoder. All of the above components are interconnected via various conductors as shown; and, they are all integrated on a single semiconductor chip.

Inverters 30a and 30b are cross-coupled to form a single storage cell having a set node S and a reset node R. To perform a write on the cells of the I-th row RI, the following circuit operations occur. Initially, when signal CLK is a "1", transistors 50a and 50b turn on and charge the column conductors 51a and 51b to a "1" voltage. Also, while signal CLK is a "1", the output of NAND gate 71 is a "1", and thus all row select signals SELR1-SELRX from the decoder 73 are forced to a "0". Further while signal CLK is a "1", the memory data signals DATA1-DATA16 are placed in respective states that are to be written into the cells of row RI; the address signals A1-AN are generated such that their binary value equals "I"; and, the write enable signal WE is generated as a "1".

Thereafter, when signal CLK goes to "0", the output of NAND gate 71 also goes to "0", and that enables the decoder 73 which generates signal SELRI as a "1". Also, the "0" from NAND gate 71 is changed to a "1" by inverter 53; and in response transistors 52a and 52b turn on. Consequently, the input data signals DATA1-DATA16 pass onto the column conductors 51a and 51b and into the storage cells of row RI. Thereafter, the row write operation is completed when the clock signal CLK goes to a "1". When that occurs, the address signals A1-AN and the DATA signals can change and be set up for the next row write operation, or the WE signal can go to "0".

Next, to perform a column clear on the J-th column "CJ", signal CLRCJ is generated as a "1" when the clock signal CLK is a "0". In response, AND gate 64 generates a "1" on conductor 60 in column CJ; thus transistor 32 in each cell of column CJ turns on; and, consequently the set node S of each cell is forced to a "0".

Further, when AND gate 64 generates a "1" on conductor 60 in column CJ, transistors 61, 62, and 63 also turn on. By turning on transistor 63, the gate of transistors 52a and 52b are coupled to ground, and thus those transistors turn off. Consequently, the J-th input data signal DATAJ which would normally be passing through transistors 52a and 52b during a row write operation is cut off from the column conductors 51a and 51b. By the above, the column clear operation overrides a simultaneous row write operation in whatever cell is common to the selected row and selected column.

At the same time, the turning on of transistors 61 and 62 generates a "0" onto the column conductor 51a and a "1" onto the column conductor 51b. Thus the column conductors 51a and 51b are placed in the same state that occurs when a "0" is being written into a cell by a DATAJ signal during a row write operation. This causes the set node "S" of the cell which is common to the selected column to go to a "0" about twice as fast as would otherwise occur if transistors 61 and 62 were eliminated.

Lastly, the "0" state of all of the cells in row R1 are detected by components 33, 41-1, and 42-1. In operation, transistor 42-1 turns on whenever signal CLK is a "0", and that couples conductor 41-1 to a "1" voltage. However, if node "S" of any cell in row R1 is at a "1" state, transistor 33 in that cell will be turned on, which in turn will force the voltage on conductor 41-1 at a "0". Conversely, if all of the cells of row R1 store a "0-", then transistor 33 in each of those cells will be turned off; and, that enables transistor 42-1 to charge conductor 41-1 to a "1".

By utilizing the above described memory 1, a variety of bookkeeping functions can be quickly performed by the control unit 20. For example, consider a scenario where control unit 20 is a digital computer in a factory that builds dozens of different mechanical modules with each module consisting of several parts, many of which are used in more then one module. In that case, the rows R1, R2, . . . in the memory 1 can be correlated to respective mechanical modules M1, M2, . . . that are built in the factory, and the columns C1, C2, . . . can be correlated to particular parts P1, P2, . . . in the modules. When the computer 20 receives an order to build the J-th module MJ, it checks an inventory file to determine which parts for that module are in stock. Then the computer 20 selects row RJ in memory 1 and it writes a "1" into those cells of the selected row which are correlated to the parts that are not in stock. These steps are repeated for other modules as orders for them are received; and, interleaved with the row write operations are column clear operations. A column clear occurs each time a part for a module is received at the factory. As a result, a zero row detect signal from the memory 1 indicates that all of the parts for a module are available and construction of the module can begin.

As another example, suppose that the control unit 20 again is a digital computer; and suppose that this computer receives various complex data processing tasks to perform, each of which is divisible into multiple subtasks. In that case, each row of the memory 1 is correlated to a particular task, and each column is correlated to a subtask. Then when the computer 20 receives a task to perform, it selects the row which is correlated to that task and it sets to "1" the cells of the selected row which are correlated to the subtasks. Computer 20 then sends the subtasks to respective subunits which perform the tasks during different periods of time. These steps are repeated for each task that computer 20 receives, and interleaved with the row write operations are column clear operations. A column clear occurs each time a subunit completes its subtask. As a result, a zero row detect signal indicates when an entire task is completed.

To fully appreciate the speed by which the FIG. 1 memory enables the above bookkeeping functions to be performed, consider the case where the memory has 256 rows (i.e.—there are 256 modules or 256 tasks). In that case, using the FIG. 1 memory, all 256 cells of a column can be cleared to a "0" with a single clock pulse to indicate the receipt of one part or completion of one subtask. By comparison, if a prior art memory is used, each row would first have to read; then a bit in the row data would have to be changed from a "1" to "0"; and then the modified row data would have to be written back into the memory. This would require three clock cycles per row, or a total of 3×256 clock cycles for all of memory rows. Thus the disclosed memory increases performance of the bookkeeping functions by over 76,000 percent;

A preferred embodiment of a bookkeeping memory has now been described in detail. In addition, however, many changes and modifications can be made to these details without departing from the nature and spirit of the invention. For example, in the above described memory, a "1" can be represented by a high voltage level and a "0" can be represented by a low voltage level, or vice versa. Similarly, the zero detect circuit can be configured as shown in FIG. 2 to detect a low voltage at the set node S of each cell in the row; or alternatively, that circuit can be coupled to the reset node R of each cell to detect a low voltage on each of the reset nodes. Further, at the cost of increasing power dissipation in the memory, each of the transistors 42-1 thru 41-X in the FIG. 2 memory can be replaced with resistors. Also, at the cost of making the row write end column clear operations a bit slower, data can be written into each cell from the set node only, in which case components 31b, 50b, 51b, 52b, and 62 in each column could be eliminated.

Accordingly, it is to be understood that the invention is not limited to just the above described embodiment but is defined by the appended claims

What is claimed is:

1. A bookkeeping memory which is comprised of:
a plurality of storage cells that are intercoupled as a matrix of rows and columns;
row write means for selecting said storage cells by row and respectively writing each of the storage cells of a selected row to a "1" or "0" state;
column clear means for selecting said storage cells by column and for clearing all of the storage cells of a selected column to said "0" state; and,
zero row detect means for generating output signals indicating which rows of said storage cells, if any, are all in said "0" state.

2. A memory according to claim 1 wherein said row write means and said column clear means respectively select a row and a column of storage cells at the same time, and said column clear means overrides said row write means in any storage cell that is common to said selected row and said selected column.

3. A memory according to claim 1 wherein said column clear means selects multiple columns of storage cells in parallel and clears all of the storage cells of the selected columns at the same time.

4. A memory according to claim 1 wherein said row write means includes at least one conductor in each column of cells which carries a variable bit to a selectable storage cell of the column, and said column clear means overrides said variable bit with a predetermined bit in any column which said column clear means selects.

5. A memory according to claim 1 wherein said row write means includes at least one conductor in each column of cells which carries a variable bit to a selectable storage cell of the column, and said column clear means includes another conductor in each column of cells which carries a predetermined bit to all of the cells of the column.

6. A memory according to claim 1 wherein said zero row detect means includes in each row—an output conductor, a means for charging said output conductor, and a respective transistor for each storage cell in the row which discharges said conductor only if the corresponding storage cell is in said "1" state.

7. A memory according to claim 1 wherein said "1" state is a high voltage state and said "0" state is a low voltage state.

8. A memory according to claim 1 wherein said "1" state is a low voltage state and said "0" state is a high voltage state.

9. A memory according to claim 1 wherein all of said storage cells, row write means, column clear means, and zero row detect means are integrated on a single semiconductor chip.

10. A memory according to claim 1 wherein said row write means, column clear means, and zero row detect means each receive a clock signal and synchronize their respective operations to said clock signal.

11. A memory according to claim 1 wherein each of said storage cells consists of a pair of cross-coupled inverters.

12. A memory according to claim 1 wherein said row write means and said column clear means respectively select one row and multiple columns of storage cells at the same time, and said column clear means overrides said row write means in all storage cells that are common to said selected row and any selected column.

13. A memory according to claim 12 wherein each column of storage cells includes at least one conductor which carries a variable bit to a selectable storage cell of a column, and said column clear means replaces said variable bit with a predetermined bit in any column which said column clear means selects.

14. A memory according to claim 13 wherein each column of storage cells further includes another conductor which carries another predetermined bit to all of the cells of the column.

15. A memory according to claim 14 wherein said zero row detect means includes in each row—a conductor, a means for charging said conductor, and a respective transistor for each storage cell in the row which discharges said conductor only if the corresponding cell is in said "1" state.

* * * * *